United States Patent
Kuki et al.

(10) Patent No.: US 6,233,715 B1
(45) Date of Patent: May 15, 2001

(54) SYNCHRONOUS SERVO GRAY CODE DETECTOR USING A PR4 MATCHED FILTER

(75) Inventors: Ryohei Kuki, Tokyo (JP); Koshiro Saeki, Irvine, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/223,244

(22) Filed: Dec. 30, 1998

(51) Int. Cl.$^7$ ................................. G06F 7/02; G11B 5/09; H03M 5/06
(52) U.S. Cl. ........................ 714/795; 714/819; 360/41; 341/68
(58) Field of Search ..................................... 714/746, 795, 714/806, 807, 809, 810, 819, 792; 341/94, 97, 98, 68, 69, 143; 360/49, 55, 41

(56) References Cited

U.S. PATENT DOCUMENTS

| | | |
|---|---|---|
| 5,345,342 | 9/1994 | Abbott et al. . |
| 5,384,671 | 1/1995 | Fisher . |
| 5,408,503 | 4/1995 | Kahlman . |
| 5,420,730 | 5/1995 | Moon et al. . |
| 5,521,945 * | 5/1996 | Knudson ............... 375/341 |
| 5,585,975 | 12/1996 | Bliss . |
| 6,031,474 * | 3/2000 | Kay et al. .............. 341/106 |
| 6,032,284 * | 2/2000 | Bliss ................... 714/792 |

OTHER PUBLICATIONS

Paul H. Siegel et al., "Modulation and Coding for Information Storage", IEEE Communications Magazine, 12–1991 pp. 68–86.

* cited by examiner

Primary Examiner—Christine T. Tu
(74) Attorney, Agent, or Firm—W. Daniel Swayze, Jr.; Wade James Brady, III; Frederick J. Telecky, Jr.

(57) ABSTRACT

This invention relates to improvements in servo Gray code detection techniques in rotating data storage drives such as hard disk drives, or the like. The detection technique uses a rate ¼ Gray code servo signals equalized to a PR4 target, and a matched filter detector, and can realize a servo Gray code detector having high speed and performance. The Gray code detector (30) has an input (44) for receiving an input signal containing a Gray code that has been equalized to a PR4 target and a circuit (40–42, 46) for processing said input signal to determine a maximum Euclidean distance from zero to a value of the Gray code. The construction of the detector (30) depends upon the particular Gray code that is employed. A threshold detector (50) determines whether the determined Euclidean distance exceeds a predetermined threshold, and produces a first output signal if the Euclidean distance exceeds the predetermined threshold and to produce a second output signal if the Euclidean distance does not exceed the predetermined threshold. An exclusive-or gate (54) may also be provided if the Gray code results in negative output numbers to compare an output of said comparator to an alternating sequence of zero and one.

41 Claims, 3 Drawing Sheets

SYNCHRONOUS SERVO GRAY CODE DETECTOR USING A PR4 MATCHED FILTER

BACKGROUND OF THE INVENTION

1. Field of the Invention

This invention relates to improvements in mass storage devices, or the like, and more particularly to improvements in detectors and methods for detecting and processing servo information contained on a data track of a mass data storage device, or the like, and still more particularly to improvements in such Gray code servo signal detectors and techniques which employ PR4 equalization techniques and inverted non-return-to-zero (NZRI) Gray code encoding.

2. Relevant Background

In modern computers and computer-type applications, one or more mass data storage devices may be employed. Typical mass data storage devices, often referred to as hard disk drives, CD-ROMs, or the like, have one or more rotating data storage disks. The data storage disks may have thereon, for example, a magnetic, optical, or other media that can contain data. In such devices, data is generally recorded in certain field portions of rings or tracks that are physically located progressively radially outwardly from the center of the disk.

The term "data" is used herein generally to mean data of all kinds, including servo data, such as Gray code information, AGC signals, head alignment bursts, and the like, recorded in servo sectors, and including user data, recorded in user data sectors, as described below in detail. Of particular concern herein, each track has one or more servo sectors located at spaced locations along the track. Each servo sector has a number of fields, each for providing information for location or control of the head data transducer. Typically, for example, each servo sector includes a field that contains an AGC burst, which, when read, enables AGC circuitry associated with the disk to automatically adjust the gain in the head amplifiers to enable the following data to be properly detected.

Generally, following the AGC burst is a field that contains one or more sync marks so that the longitudinal position of the head relative to the track of interest can be determined. It should be noted that the field that contains the sync marks might not follow the AGC field in every embodiment, but may be located at some other place along the length of the track. The sync marks may be used, for example, to enable subsequent fields, such as the user data sectors or Gray code data to be located by counting a predetermined elapsed time from the time that the sync marks are detected.

A Gray code field may follow the sync mark field in the servo sector. The Gray code field may contain Gray code data from which the identification of the particular radial track over which the head is positioned can be established. Following the Gray code field is a field containing binary data, for example, to contain longitudinal track identification information, so that the identity of each track region between adjacent servo sectors can be established. After the binary data field, a number, typically four, burst fields are presented for more precision alignment of the head laterally with respect to the selected track.

In order to read the data that has been previously recorded on the data medium one or more data transducers, or heads, are provided that are selectively radially moved over a desired ring containing the data that is to be read. The aforementioned Gray codes pre-recorded onto each data ring are decoded to determine the instantaneous position of the data transducer heads, in known manner. The data transducer heads are typically positioned by means of a closed-loop servo system in accordance with the decoded Gray code that has been detected. More particularly, the data transducer heads read the Gray code servo information recorded within data tracks on disks. The servo information typically includes track addresses, and optionally sector addresses and servo bursts. The track addresses are used as coarse positioning information and servo bursts are used as fine positioning information.

As the transducer heads are being moved to a desired track location, the transducer head reads the track addresses provided by the Gray codes in order to determine its instantaneous location. Of course, the transducer head may be positioned between two adjacent tracks, and may receive a superposition of signals from both tracks; however, due to the data characteristics of Gray codes, the position ambiguity can be easily resolved. Thus, when the head is on an interface between two tracks, either of the two track addresses will be correctly detected, due to the characteristics of the Gray code used.

The data sectors on the selected track may be synchronously recovered after timing acquisition by a phase lock loop circuit, but the detection of the servo sectors on a track are usually asynchronously performed.

It is difficult to realize high-speed detection and high-density recording by asynchronous servo detection methods. Consequently, various synchronous servo techniques have been employed, one of which being PRML signal processing. In this approach, timing is synchronized in the servo preamble region by a phase lock loop circuit, and the track address and servo bursts are synchronously sampled and are decoded.

Recently, disk drive manufacturers have been striving to achieve greater capacity in the disk drives that they have been producing. To this end, data has been recorded onto the data medium more densely, and other techniques have been employed to realize this goal. As result, interference between adjacent data symbols often referred to as inter-symbol-interference, or ISI, has increased, lowering the signal-to-noise ratio in the detected signals from the data medium. As a result, it has become more difficult to properly detect the signals read from the data medium, which, in turn, has resulted in increasing the difficulty in rapidly and properly positioning the data head transducers.

In the past, many manufacturers have used a rate ⅓ Gray code and a PR4 Viterbi detector for Gray code detection. This technique has been preferred because the signals of Gray codes are typically equalized to PR4 targets, and the PR4 Viterbi detector typically used can realize the performance of the ⅓ Gray code, which has an Euclidean distance of $d^2=2$, which results in about a 3 dB improvement in the signal-to-noise ratio. Although proposals have been made to use ¼ rate Gray codes, which have increased performance, and which have Euclidean distances of $d^2=4$, the ¼ Gray code signals are usually equalized to a PR4 Viterbi detector. However, the use of PR4 signals and the PR4 Viterbi detector can not realize the performance of the ¼ Gray code because the signal-to-noise ratio improvement realized by the use of a PR4 Viterbi detector is limited to $d^2=2$, or 3 dB.

If an EPR4 Viterbi is used, a Gray code signal equalized by a PR4 equalizer is required, and an additional (1+D) filter is needed between the equalizer and the Viterbi. The (1+D) filter, however, increases the noise in the channel. Therefore, the overall performance improvement is less than 3 dB in spite of the increase of the Euclidean distance ($d^2$) in the code. Thus, the EPR4 channel with a ¼ Gray code is only about 1.5 dB better then a PR4 channel with a ⅓ Gray code in high channel densities (k=PW50/$T_c$, more than 2.5), but the EPR4 channel with the ¼ Gray code is worse than the PR4 channel with the ⅓ Gray code in the low channel densities (k<1.5) in.

It is possible to improve the PR4 and EPR4 Viterbi detector performance by using an additional error correction unit (ECU) which corrects the code violated data. But the improvement is not significantly large.

What is needed, therefore, is a system and method that reduces the signal-to-noise ratio in the data read channel of a mass storage device, or the like, and in particular to circuitry that can be used to detect and employ ¼ Gray code signals together with a PR4 Equalizer and a matched filter detector in the positioning of the data head transducers.

SUMMARY OF THE INVENTION

Accordingly, one of the salient advantages provided by the present invention is the provision of a high performance and simple synchronous Gray code detection method and apparatus for enabling the use of high servo clock rates and high recording density of servo information by improving the signal-to-noise performance of the apparatus.

According to a broad aspect of the invention improvements in servo Gray code detection techniques in rotating data storage drives such as hard disk drives, or the like, is presented. The detection technique uses a rate ¼ Gray code servo signals equalized to a PR4 target, and a matched filter detector, and can realize a servo Gray code detector having high speed and performance. The Gray code detector has an input for receiving an input signal containing a Gray code that has been equalized to a PR4 target and a circuit for processing said input signal to determine a maximum Euclidean distance from zero to a value of the Gray code. The construction of the detector depends upon the particular Gray code that is employed. A threshold detector determines whether the determined Euclidean distance exceeds a predetermined threshold, and produces a first output signal if the Euclidean distance exceeds the predetermined threshold and to produce a second output signal if the Euclidean distance does not exceed the predetermined threshold. An exclusive-or gate may also be provided if the Gray code results in negative output numbers to compare an output of said comparator to an alternating sequence of zero and one.

BRIEF DESCRIPTION OF THE DRAWING

The invention is illustrated in the accompanying drawings, in which.

In the various Figures of the drawing, like reference numerals are used to denote like or similar parts.

DETAILED DESCRIPTION OF THE PREFERRED EMBODIMENTS

Figure 1:
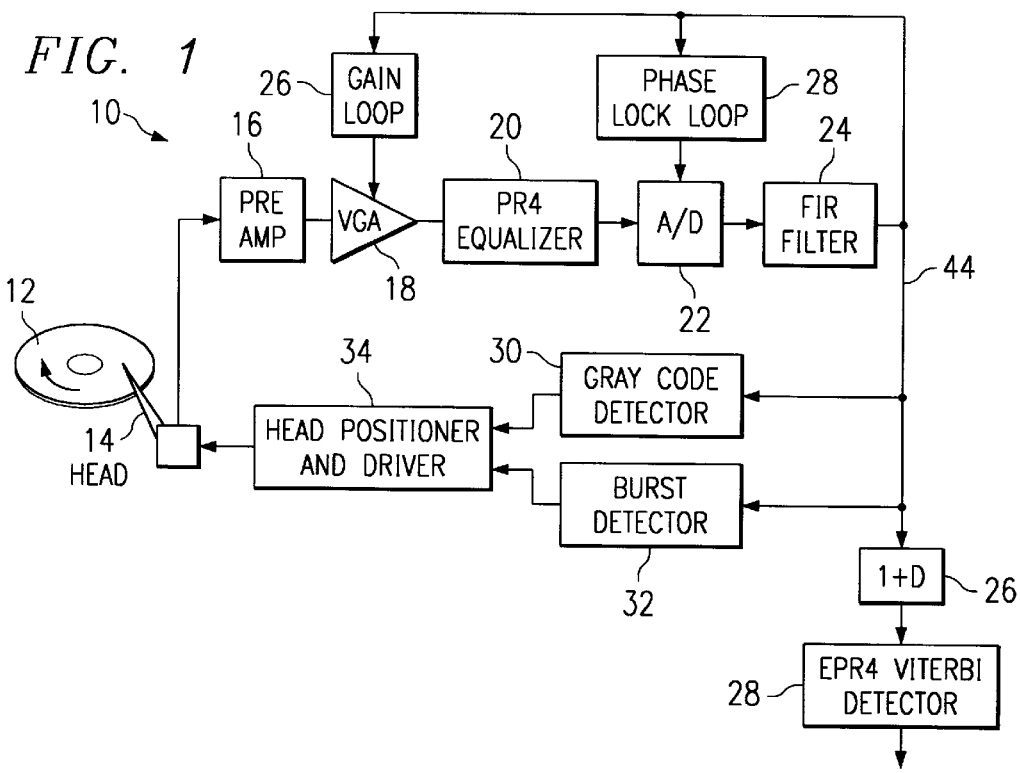
FIG. 1 is a simplified block diagram of a read channel of a typical mass data storage device, or the like, used, among other things, to detect Gray codes used in a servo circuit for positioning the data transducer heads of the associated mass data storage device, in accordance with a preferred embodiment of the invention.

A block diagram of a circuit 10 of a portion of a read channel of a mass storage device is shown in FIG. 1. The mass storage device includes a rotating disk 12 having an associated read transducer head 14 that is selectively radially positionable to read data contained on the concentric paths formed on the disk 12. The signals read by the head transducer 14 are amplified in a pre-amplifier circuit 16, which generates an output signal applied to an input of a variable gain amplifier (VGA) 18. The gain of the VGA 18 is controlled in a feedback loop, described below. Thus, the signals from the head are amplified by the preamplifier circuit 16 and the magnitude of the signals is adjusted by the VGA 18.

The output from the VGA 18 is connected to a PR4 continuous time equalizer 20. The output from the PR4 equalizer 20 is digitized in an analog to digital converter 22, the output of which is connected to the input of an FIR filter 24. The signals are equalized to a PR4 target by the continuous time PR4 equalizer and the FIR filter 24, in known manner. The output from the FIR filter 22 is connected to gain loop circuit 26 to control the amplitude of the signal provided by the VGA 18, and also to a phase lock loop circuit 28, which recovers a timing signal to control the analog to digital converter 22.

The output from the FIR filter 24 is connected to a second filter 26, which provides an output for detection in an EPR Viterbi detector 28. Thus, as shown, the response of the second filter 26 which, in combination with be response of the FIR filter 24, conditions the signal to be suitable for an EPR4 target. Thus, if the response of the entire filter 24 is $(1+D)^2$ the response of the second filter 26 may be $(1+D)$. As the PR4 signals from the data sections pass through the $(1+D)$ filter 26, they become EPR4 signals. The EPR4 Viterbi detector 28 recovers the data from the data sectors, in well-known manner.

The output from the FIR filter 24 is also connected to the input of a Gray code detector 30, constructed accordance with the invention as below described in detail, and to the input of a burst detector circuit 32. The outputs from the Gray code detector 30 and burst detector circuit 32 are connected to a head positioner and driver circuit 34, which controls the movement of the transducer head 14 to the selected position determined by the Gray code detected by the Gray code detector 30.

Figure 2:
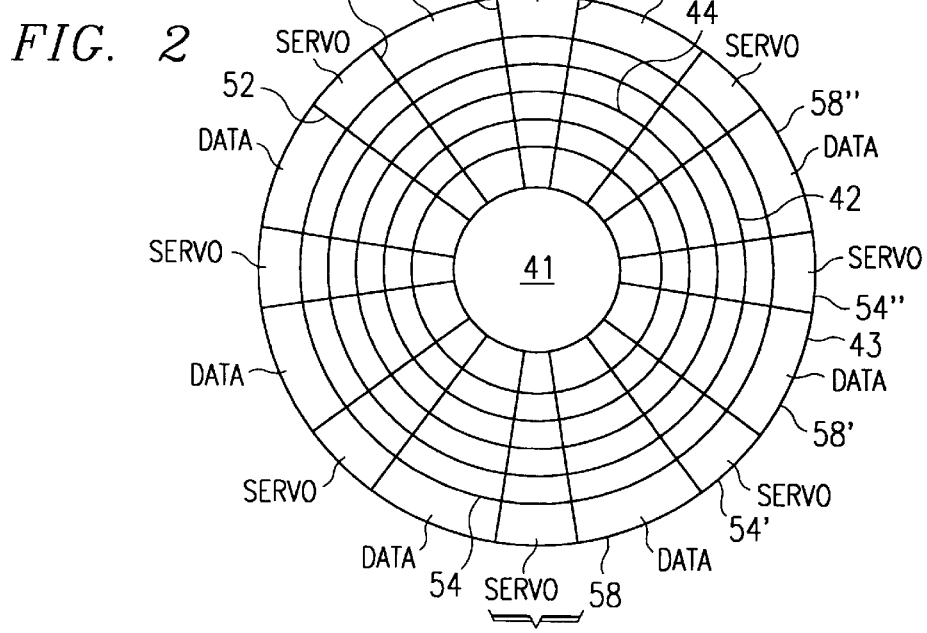
FIG. 2 is a diagram of a typical data disk used in a mass data storage device, or the like, illustrating a typical radial ring layout of the data tracks thereof, together with a diagram showing a typical layout of a sequence of data longitudinally along a portion of a track which may be used in the construction of the disk.
Figure 2:
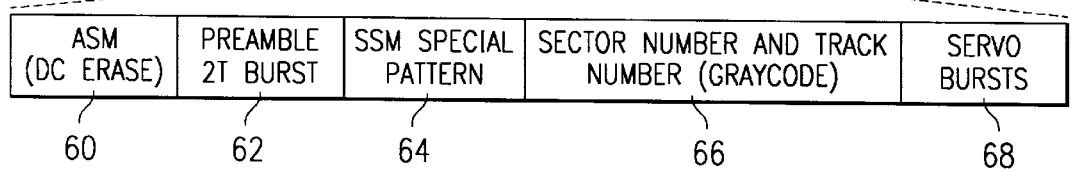

FIG. 2 illustrates a portion of a mass data storage device environment in which the present invention may be practiced. The mass data storage device includes a data disk or platter 40, which may be a disk coated with a magnetic material of the type used in a typical hard disk drive assembly. Data and other information are written onto a number of concentrically located tracks or rings 42 . . . , 44 . . . , and so on.

The tracks 42 . . . , 44 . . . typically contain user data sectors and servo sectors, below described in detail, arranged in concentric rings from the inside diameter of the disk at the hub 41 to the outside diameter of the disk at the edge 43. Spaced radial lines 46, 48, 50, 52 . . . , are also shown emanating from the hub 41 to the edge 43. The lines 46, 48, 50, 52 . . . , do not actually exist in a physical device, but are shown for purposes of illustrating the alignment of the fields of the tracks 42, . . . , 44, . . . , as described below. The lines 46, 48, 50, 52 . . . correspond to the location of the servo sectors at each respective intersection of the lines with the rings 42 . . . , 44 . . . , and so on. (Although the lines 46, 48, 50, 52 . . . , are shown as being continuous, it should be understood that in many cases they may have jogs at certain locations due to the difference in the number of sectors that can exist in the longer outward rings compared to the number of sectors that can exist in the shorter inward rings.)

A servo sector exists at the junction of each of the radial lines 46, 48, 50, 52, . . . , and its respective track. It should be noted that servo sectors are written by the disk drive manufacturer by a device known as a track writer. These servo sectors are never re-written. The process of writing the servo sectors is known as hard formatting, as opposed to soft formatting, which is performed by the end user for different purposes.

A portion of one of the rings or tracks within one of the sectors 46, 48, 50, 52, for example, the sector portion 54, is shown in the lower portion of FIG. 2. The sector portion 54 may be identical to other servo sector portions that repeat continuously around the ring 42, and includes a number of servo sectors 54, 54' . . . , that separate respective user data sector regions 58, 58' . . . .

The user data sectors 58, 58 . . . , are of known format. On the other hand, the servo sectors 54, 54' . . . , themselves may include a number of fields. The precise content of the fields in each servo sector may vary from manufacturer to manufacturer, and, moreover, may be presented in differing sequential order from manufacturer to manufacturer. However, a typical servo sector 54 may include an initial asynchronous servo mark (ASM) field 60, as shown. The ASM pattern is used for the servo sector search. A long DC erase pattern, such as a pattern that would not be encountered in data sectors, may be used as the ASM field to find the start of the servo sector. The preamble pattern is typically used for acquiring synchronous timing by the phase lock loop circuit.

The ASM field may be followed by a preamble field 62 which may contain, for example, a 2 T burst, which may followed by a synchronous servo mark (SSM) field 64, which may contain a special pattern, if desired. The SSM pattern is used to detect the start point of the Gray codes and enables the servo bursts to be synchronously detected.

Following the SSM field 64 is the Gray code field 66 of interest herein, which may contain, for example, an encoded sector number and an encoded track number. Following the Gray code field 66 is a series of servo bursts in burst fields 68. The burst fields 68 are used typically to ensure the alignment of the head squarely along the track or path of the ring being followed. After the burst fields 68, the data sectors 58 follow, as shown in the upper part of the drawing.

Of primary interests is the Gray code field 66, which contains Gray code data. The Gray code data may be encoded in a number of different ways. One-way, for example, in which the track address signals may be preferably recorded is by a rate ¼ Gray code, equalized to PR4 target. This encoding technique enables the Gray code signals to be recovered by the Gray code detector 30, which uses a matched filter. Although other encoding techniques can be used, the combination of the rate ¼ Gray code and the matched filter detector gives much better performance than that, for example, of the rate ⅓ Gray code and a conventional PR4 Viterbi detector.

As mentioned above, the Gray codes that may be employed can be encoded in a number of different ways. In accordance with the method of a preferred embodiment of the invention, the determination of the Gray code encoding technique that is preferred to be used maximizes the squared Euclidean distance between each pair. The larger the Euclidean distance, the greater the performance of the code. For example, in the case of a rate ⅓ Gray code, the codes that can be used in a PR4 channel are shown in the following table I.

TABLE I

Rate ⅓ Gray code pairs

| Case | NRZI Encoded Data | | | PR4 Equalized Data | | | Euclidean distance |
| --- | --- | --- | --- | --- | --- | --- | --- |
| | 0 | | 1 | 0 | | 1 | |
| 1 | 000 | ← → | 110 | 000 | ← → | 10 -1 | d2=2 |
| 2 | 010 | ← → | 100 | 011 | ← → | 110 | d2=2 |

The Gray codes listed in the table I above satisfy all the required Gray code constraints. It should be noted that in case number 1, the logical "0" of the Gray code is encoded to "000" and that the logical "1" is encoded to "110" in an NRZI expression. In an NRZI expression, a "1" means that a magnetic transition has occurred (i.e., a data state change has occurred) and a "0" means that no magnetic transition has occurred.

In case number 1, the logical "0" of the Gray code is encoded to "000" and the logical "1" is encoded to "110" in the NRZI expression. The "1" in NRZI means a magnetic transition, and the "0" means no magnetic transition. Likewise, in case number 2, the logical "0" is encoded to "010", and the logical "1" is encoded to "011" NRZI. After PR4 equalization, the "010" becomes an NRZI "011", and the "100" of the NRZI encoded data becomes "110". In each case, the squared Euclidean distance ($d^2$) between the PR4 encoded data for the zero and one is 2.

The rate ¼ Gray codes that can be used in a PR4 channel are shown in the following table II:

TABLE II

Rate ¼ Gray code pairs that can be used in a PR4 channel

| Case | NRZI Encoded Data | | | PR4 equalized Data | | | Euclidean distance |
| --- | --- | --- | --- | --- | --- | --- | --- |
| | 0 | | 1 | 0 | | 1 | |
| 1 | 0000 | ← → | 1010 | 0000 | ← → | 11 -1 -1 | d2=4 |
| 2 | 0010 | ← → | 1000 | 0011 | ← → | 1100 | d2=4 |
| 3 | 0100 | ← → | 1110 | 0110 | ← → | 100 -1 | d2=4 |
| 4 | 0110 | ← → | 1100 | 010 -1 | ← → | 10 -1 0 | d2=4 |
| 5 | 0000 | ← → | 0110 | 0000 | ← → | 010 -1 | d2=2 |
| 6 | 0000 | ← → | 1100 | 0000 | ← → | 10 -1 0 | d2=2 |
| 7 | 0010 | ← → | 0100 | 0011 | ← → | 0110 | d2=2 |
| 8 | 0100 | ← → | 1000 | 0110 | ← → | 1100 | d2=2 |
| 9 | 1000 | ← → | 1110 | 1100 | ← → | 100 -1 | d2=2 |

The rate ¼ Gray codes that can be used in an EPR4 channel are in the following table III:

TABLE III

Rate ¼ Gray code pairs that can be used in an EPR4 channel

| Case | NRZI Encoded Data | | EPR4 equalized Data | | Euclidean distance |
|---|---|---|---|---|---|
| | 0 | 1 | 0 | 1 | |
| 1 | 0000 ←→ 1100 | | 0000 ←→ 11 -1 -1 | | $d^2=4$ |
| 2 | 0100 ←→ 1000 | | 0121 ←→ 1210 | | $d^2=4$ |

TABLE IV

Detection of Rate ¼ Gray code pairs

| Gray Codes | 1 | 0 | 1 | 1 | 0 |
|---|---|---|---|---|---|
| NRZI | 1010 | 0000 | 1010 | 1010 | 0000 |
| PR4 | 11-1-1 | 0000 | 11-1-1 | 11-1-1 | 0000 |
| Filter Out (F) | 4 | 0 | 4 | 4 | 0 |
| Detection (D) | 1 | 0 | 1 | 1 | 0 |

The squared Euclidean distance ($d^2$) between each pair shows the potential performance of the code. The $d^2$ of the potential ¼ codes from the above 5 to 9 in Table II have a Euclidean distance of only 2. Thus, these pairs of codes may be discarded. (It should also be noted that the Euclidean distance $d^2$ of the ¼ codes is twice as large as those of the ⅓ codes, though the code rate is decreased from ⅓ to ¼.)

As noted above, one of the advantages that is realized by the circuits and technique of the invention is that ¼ rate Gray codes can be employed with a PR4 equalizer and matched filter detector to realize significant signal-to-noise ratio advantages, and, in particular, the greatest signal-to-noise ratio advantage and high performance Gray code detection can be achieved by using a ¼ Gray code, PR4 signals, and a matched filter. To this end, Gray code case numbers 1, 2, 3, or 4 can be used to best advantage; however, the particular Gray code detector 30 must be constructed in accordance with the particular Gray code that is selected.

Figure 3:
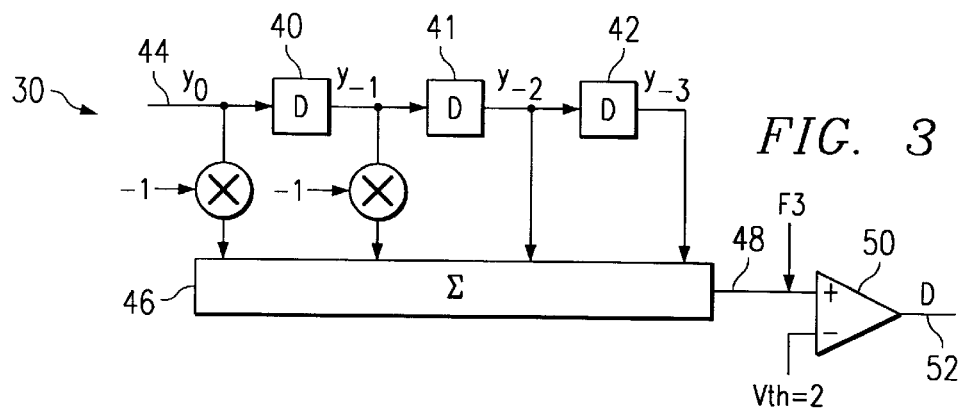
FIGS. 3–6 are electrical schematic diagrams of preferred embodiments of Gray code detectors that may be used in detecting different ¼ Gray codes in PR4 channels of a mass data storage device, in accordance with preferred embodiments of the invention.

Thus, with additional reference now to FIG. 3, a block diagram of a Gray code detector is shown that may be used in conjunction with the ¼ Gray code illustrated in case 1 of table II. The Gray code detector includes 3 delay day elements 40, 41, and 42 connected in series. Each of the delay elements delay the incoming signal on input line 44 a time "D", which corresponds to the time delay between the symbols to be detected. The signals at the various points along the series of delay blocks 40–42 are denoted by $y_0$, $y_{-1}$, $y_{-2}$, and $y_{-3}$. (It should be noted that the order of the symbols or bits may be reported in alternate order, since symbol $y_{-3}$ actually occurs first, and symbol $y_0$ occurs last.)

The signal $y_0$ on the input line 44 is multiplied by −1, and, additionally, the signal $y_{-1}$ on the line between delay blocks 40 and 41 is multiplied by −1. The two multiplied signals, as well as the signals between delay blocks 41 and 42 and the output delay block 42, are summed by a summer circuit 46. The output signal on line 48, therefore, represents $-y_0 +- y_{-1} + y_{-2} + y_{-3}$.

The output signal on line 48 is then compared to a threshold voltage by a comparator 50, which produces an output on output line 52 that indicates the detection, or not, of the specified Gray code. Or particular, the threshold voltage applied to the inverting input of the comparator 30 is set at $V_{th}=2$. Therefore, if the sum produced by the summer circuit 46 exceeds 2, the comparator circuit 50 will produce an output, otherwise, no output will be produced.

Figure 4:
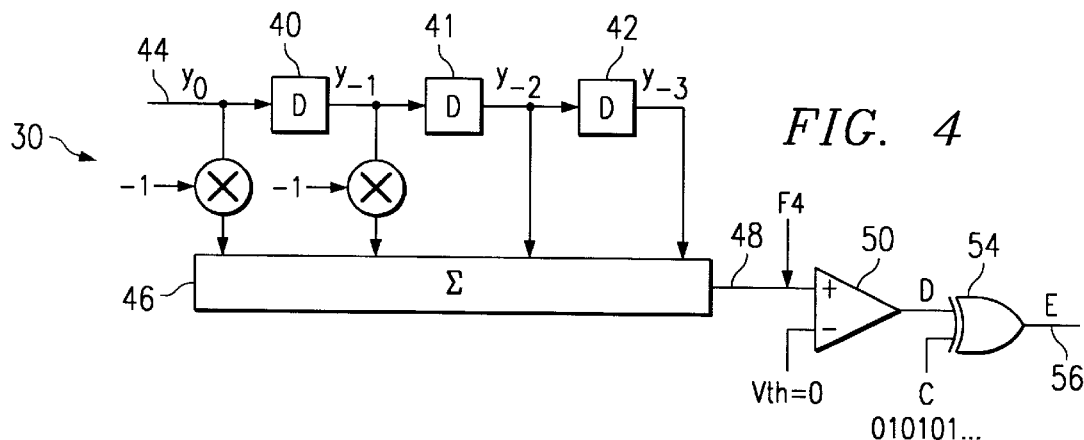

Still more particularly, the operation of the detector 30 using the circuit shown in FIG. 4 is described with reference to the following table IV.

It can be seen from table 4 that a Gray code which equals "1" is encoded to NRZI equals "1010", and that a Gray code which equals "0" is encoded to NRZI equals "0000". The encoded "1010" will be "10-10" at the output of the head 14 (see FIG. 1), which will become "11-1-1" after PR4 equalization. On the other hand, the NRZI "0000" will become "0000" after PR4 equalization. As can be seen from FIG. 1, the signals that are equalized to PR4 are directed to the Gray code detector 30, which, for a Gray code of case 1 in table II, is configured in the manner shown by the detection filter 30 in FIG. 4. The transfer function of the filter of FIG. 4 is, as noted above, $-y_0 +- y_{-1} + y_{-2} + y_{-3}$, and is matched to PR4 signals of the Gray code.

As noted above, the comparator 50 of the circuit in FIG. 4 determines whether the Gray code is a code "1" or "0" when the four bits of the Gray code are in the filter. The detection threshold of the filter is set so that if the output of the filter is equal to more than two, the detector outputs the Gray code "1", otherwise the detector outputs "0".

For further example, for a Gray code that corresponds to the code of case 2 of table II, a Gray code detector circuit constructed according to the block diagram of FIG. 4 can be employed. The circuit 30 FIG. 4 is similar to the circuit 30 of FIG. 3, except that the threshold applied to the comparator 50 is set at $V_{th}$ equals 0. The output from the comparator 50 is compared to and exclusive OR'ed with a signal C=010101 . . . . Except for the threshold voltage in the provision of an exclusive-or gate 54 the remainder of the circuit of FIG. 4 is the same as the circuit described above with reference to FIG. 3. The transfer function at the output line 48 is $-y_0 +- y_{-1} + y_{-2} + y_{-3}$.

Thus, it can be seen that the Gray code "1" is encoded to NRZI equals "1000", and the Gray code "0" is encoded to NRZI equals "0010". (It should be noted that the "1" may also be encoded to "0010", and the "0" may be encoded to "1000"). The NRZI equals "1000" will be "1100" or "-1-1 00" after PR4 equalization. On the other hand, the NRZI equals "0010" will be "0011" or "00-1-1" after PR4 equalization.

Thus, since the detection threshold of the filter is zero, if the output of the filter is equal to or more than zero, the comparator 50 outputs a "1", otherwise the comparator outputs a "0". Since the transfer function in F4 on line 48 is valid only when the polarity is positive (i.e.,"1100" or "0011"), if the polarity of the EPR4 signals are negative (i.e., "-1-1 00" or "00-1-1"), it is necessary to invert the output of the comparator 50. The polarity changes alternately; consequently, the comparison input "C" to the exclusive or gate 54 alternates between zero and 1. Thus, if the polarity of the odd Gray codes is always positive and the polarity of the even Gray code is always negative, then even bits of the comparator of the output are converted by the exclusive or logic by the signals of "C", which are 010101 . . . .

Figure 5:
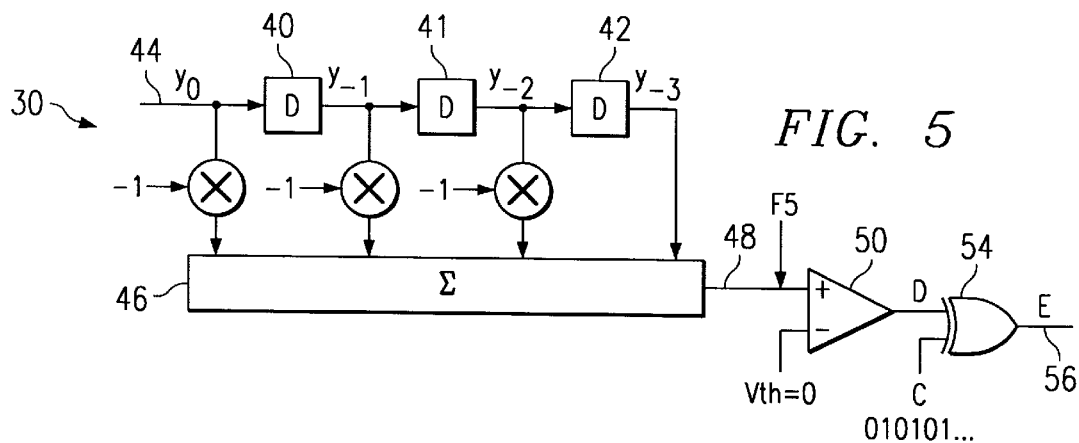

With reference additionally now to the circuit 30 of FIG. 5, which is particularly useful for detecting the Gray code set forth in case 3 of table II, the construction of the circuit is the similar to that of the detector circuit of FIG. 4, except for the multiplication of the signal between blocks 41 and 42 by −1. The threshold established at the comparator 50 is $V_{th}$ equals 0, and the inverting code "C" applied to the input of the exclusive or gate 54 is 010101 . . . . The transfer function F5 at the output from the summer 46 online 48 is $-y_0+-y_{-1}-y_{-2}+y_{-3}$.

Figure 6:
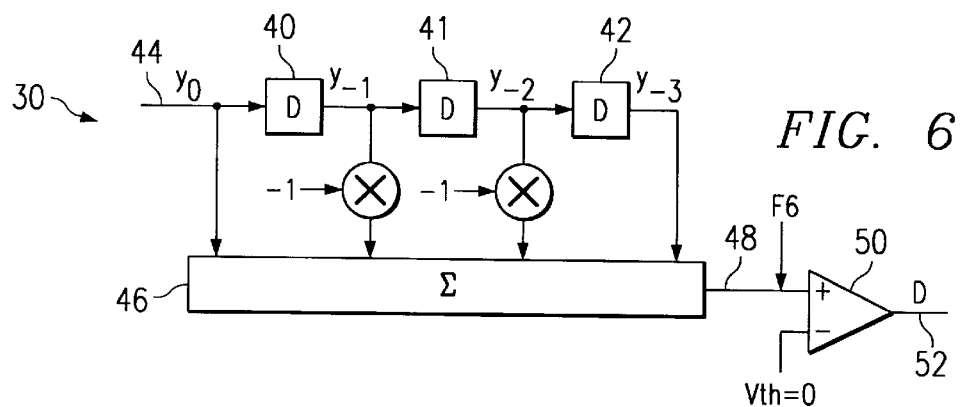

With further reference additionally to the detector circuit 30 shown in FIG. 6, which is particularly useful for decoding the Gray code of case 4 shown in table II, the circuit is similar to the circuit of FIG. 5, except for the deletion of the first multiplier for the signal on input line 44 and the deletion of the exclusive-or gate 54. The threshold of the comparator 50 is set to $V_{th}$ equals 0, and the transfer function appearing on the output line 48 is $y_0+-y_{-1}-y_{-2}+y_{-3}$.

Figure 7:
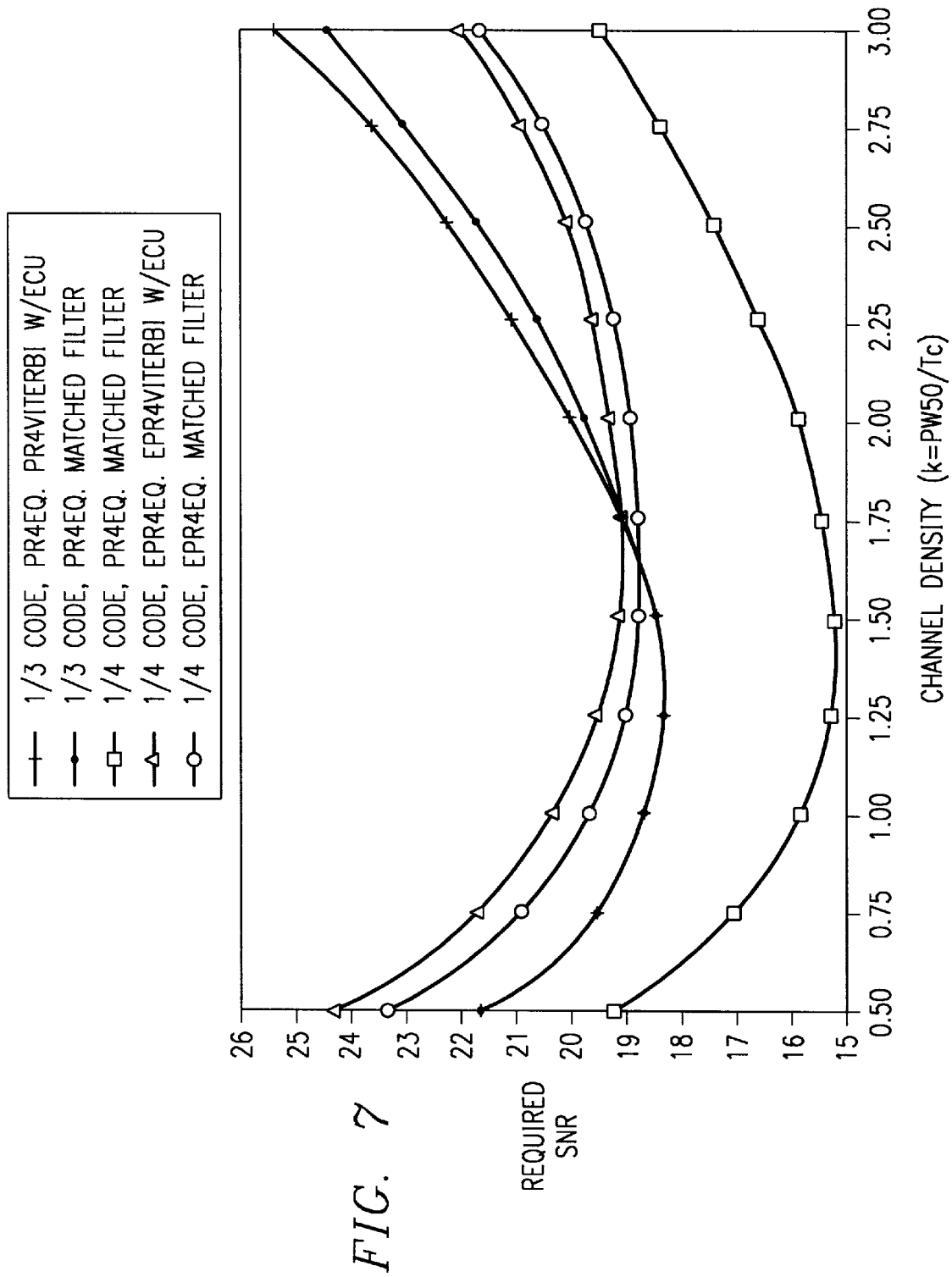
FIG. 7 is a graph of a channel density as a function of signal-to-noise ratio to illustrate performance comparisons of various Gray code detectors, including the detectors of preferred embodiments of the invention.

FIG. 7 is a graph showing the error rates of Gray code detection for the various Gray code detectors shown in FIGS. 3–6. It can be seen that the code detection scheme of the invention provides excellent performance over the significant ranges of channel densities. It should also be noted that the improved performance does not depend on the selection of the particular Gray code used.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A Gray code detector, comprising:
   an input for receiving an input signal containing a Gray code that has been equalized to a PR4 target;
   a circuit for processing said input signal to determine a maximum Euclidean distance from zero to a value of the Gray code;
   a threshold detector to determine whether the determined Euclidean distance exceeds a predetermined threshold, and to produce a first output signal if the Euclidean distance exceeds the predetermined threshold and to produce a second output signal if the Euclidean distance does not exceed the predetermined threshold.

2. The Gray code detector of claim 1, wherein said Gray code is a rate ¼ Gray code.

3. The Gray code detector of claim 1, wherein said circuit for processing said input signal comprises delay blocks to delay bits of said input signal to enable a Gray code word to be developed, a weighting circuit to weight selected bits of said Gray code word, and a summing circuit to sum said bits of said Gray code word including said weighted bits.

4. The Gray code detector of claim 1, further comprising a signal inverting circuit for inverting the first and second outputs of said threshold detector.

5. The Gray code detector of claim 4, wherein said signal inverting circuit comprises an exclusive or gate having said first and second outputs signals applied to a first input and having a repeating alternating code of zero and one applied to a second input.

6. The Gray code detector of claim 3, wherein said weighting circuit comprises a circuit to multiply said selected bits by −1.

7. The Gray code detector of claim 3, wherein said Gray code is represented by a "0" being an NRZI code of "0000", and a PR4 code of "0000", and a "1" being an NRZI code of "1010", and a PR4 code of "11-1-1".

8. The Gray code detector of claim 7, wherein said circuit for processing said input signal to determine a maximum Euclidean distance from zero to a value of the Gray code comprises three delay blocks, each producing an output representing successive bits of said Gray code, and first and second multipliers, each for multiplying a bit in first and second positions of said Gray code word by −1.

9. The Gray code detector of claim 3, wherein said Gray code is represented by a "0" being an NRZI code of "0010", and a PR4 code of "0011", and a "1" being an NRZI code of "1000", and a PR4 code of "1100".

10. The Gray code detector of claim 9, wherein said circuit for processing said input signal to determine a maximum Euclidean distance from zero to a value of the Gray code comprises three delay blocks, each producing an output representing successive bits of said Gray code, first and second multipliers, each for multiplying a bit in a first and second position of said Gray code word by −1, and further comprising an exclusive-or gate to compare an output of said comparator to an alternating sequence of zero and one.

11. The Gray code detector of claim 3, wherein said Gray code is represented by a "0" being an NRZI code of "0100", and a PR4 code of "0110", and a "1" being an NRZI code of "1110", and a PR4 code of "100-1".

12. The Gray code detector of claim 11, wherein said circuit for processing said input signal to determine a maximum Euclidean distance from zero to a value of the Gray code comprises three delay blocks, each producing an output representing successive bits of said Gray code, first, second, and third multipliers, each for multiplying a bit in a first, second, and third positions by −1, and further comprising an exclusive-or gate to compare an output of said comparator to an alternating sequence of zero and one.

13. The Gray code detector of claim 3, wherein said Gray code is represented by a "0" being an NRZI code of "0110", and a PR4 code of "010-1", and a "1" being an NRZI code of "1100", and a PR4 code of "10-1 0".

14. The Gray code detector of claim 13, wherein said circuit for processing said input signal to determine a maximum Euclidean distance from zero to a value of the Gray code comprises three delay blocks, each producing an output representing successive bits of said Gray code, and first and second multipliers, each for multiplying a bit in a first and second positions by −1.

15. A mass data storage device, comprising:
   a circuit for receiving data signals representing a Gray code;
   an equalizer circuit for modifying said data signals to a PR4 target to produce a Gray code input signal;
   a circuit for processing said Gray code input signal to determine a maximum Euclidean distance from zero to a value of the Gray code;
   a threshold detector to determine whether the determined Euclidean distance exceeds a predetermined threshold, and to produce the first output signal if the Euclidean distance exceeds the predetermined threshold and to produce a second output signal if the Euclidean distance does not exceed the predetermined threshold.

16. The Gray code detector of claim 15, wherein said Gray code is a rate ¼ Gray code.

17. The Gray code detector of claim 15, wherein said circuit for processing said input signal comprises delay blocks to delay bits of said input signal to enable a Gray code word to be developed, a weighting circuit to weight selected bits of said Gray code word, and a summing circuit to sum said bits of said Gray code word including said weighted bits.

18. The Gray code detector of claim 15, further comprising a signal inverting circuit for inverting the first and second output signals of said threshold detector.

19. The Gray code detector of claim 18, wherein said signal inverting circuit comprises an exclusive-or gate having said first and second outputs signals applied to a first input and having a repeating alternating code of zero and one applied to a second input.

20. The Gray code detector of claim 15, wherein said weighting circuit comprises a circuit to multiply said selected bits by −1.

21. The Gray code detector of claim 15, wherein said Gray code is represented by a "0" being an NRZI code of "0000", and a PR4 code of "0000", and a "1" being an NRZI code of "1010", and a PR4 code of "11-1-1".

22. The Gray code detector of claim 21, wherein said circuit for processing said input signal to determine a maximum Euclidean distance from zero to a value of the Gray code comprises three delay blocks, each producing an output representing successive bits of said Gray code word, and first and second multipliers, each for multiplying a bit in a first and second position of said Gray code word by −1.

23. The Gray code detector of claim 15, wherein said Gray code is represented by a "0" being an NRZI code of "0010", and a PR4 code of "0011", and a "1" being an NRZI code of "1000", and a PR4 code of "1100".

24. The Gray code detector of claim 23, wherein said circuit for processing said input signal to determine a maximum Euclidean distance from zero to a value of the Gray code word comprises three delay blocks, each producing an output representing successive bits of said Gray code, first and second multipliers, each for multiplying a bit in a first and second position of said Gray code word by −1, and further comprising an exclusive-or gate to compare an output of said comparator to an alternating sequence of zero and one.

25. The Gray code detector of claim 15, wherein said Gray code is represented by a "0" being an NRZI code of "0100", and a PR4 code of "0110", and a "1" being an NRZI code of "1110", and a PR4 code of "100-1".

26. The Gray code detector of claim 25, wherein said circuit for processing said input signal to determine a maximum Euclidean distance from zero to a value of the Gray code comprises three delay blocks, each producing an output representing successive bits of said Gray code, first, second, and third multipliers, each for multiplying a bit in a first, second, and third position of said Gray code word by −1, and further comprising an exclusive-or gate to compare an output of said comparator to an alternating sequence of zero and one.

27. The Gray code detector of claim 15, wherein said Gray code is represented by a "0" being an NRZI code of "0110", and a PR4 code of "010-1", and a "1" being an NRZI code of "1100", and a PR4 code of "10-1 0".

28. The Gray code detector of claim 27, wherein said circuit for processing said input signal to determine a maximum Euclidean distance from zero to a value of the Gray code comprises three delay blocks, each producing an output representing successive bits of said Gray code word, and first and second multipliers, each for multiplying a bit in a first and second position of said Gray code by −1.

29. A method for detecting a rate ¼ Gray code in a mass data storage device, comprising:

receiving data signals representing a rate ¼ Gray code which has been equalized to provide input data signals to a PR4 target;

processing said input data signals to determine a maximum Euclidean distance from zero to a value of the Gray code;

comparing the determined Euclidean distance to a predetermined threshold to determine whether the determined Euclidean distance exceeds the predetermined threshold;

producing a first output signal if the Euclidean distance exceeds the predetermined threshold;

producing a second output signal if the Euclidean distance does not exceed the predetermined threshold.

30. The method of claim 29, wherein said processing comprises delaying bits of said input signal to enable a Gray code to be developed, weighting selected bits of said Gray code, and summing said bits of said Gray code including said weighted bits.

31. The method of claim 29, further comprising inverting the first and second output signals.

32. The method of claim 31, wherein said inverting comprises exclusive or'ing said first and second outputs signals with a repeating alternating signal of zero and one.

33. The method of claim 29, wherein said weighting comprises multiplying said selected bits by −1.

34. The method of claim 29, wherein said Gray code is represented by a "0" being an NRZI code of "0000", and a PR4 code of "0000", and a "1" being an NRZI code of "1010", and a PR4 code of "11-1-1".

35. The method of claim 34, wherein said processing comprises delaying successive bits of said data input signal to produce an output representing successive bits of said Gray code, and multiplying bits in a first and second bit position of said Gray code by −1, and summing the successive and weighted bits to produce an output signal.

36. The method of claim 29, wherein said Gray code is represented by a "0" being an NRZI code of "0010", and a PR4 code of "0011", and a "1" being an NRZI code of "1000", and a PR4 code of "1100".

37. The method of claim 36, wherein said processing said data input signal comprises delaying successive bits of said data input signal to produce an output representing successive bits of said Gray code, multiplying bits in first and second positions by −1, summing the successive and weighted bits to produce an output signal, and exclusive or'ing said output signal to an alternating sequence of zero and one.

38. The method of claim 29, wherein said Gray code is represented by a "0" being an NRZI code of "0100", and a PR4 code of "0110", and a "1" being an NRZI code of "1110", and a PR4 code of "100-1".

39. The method of claim 38, wherein said processing said data input signal comprises delaying the successive bits of said data input signal to produce an output representing successive bits of said Gray code, multiplying bits in a first, second, and third position by −1, summing the success the weighted bits to produce an output signal, and exclusive or'ing said output signal with an alternating sequence of zero and ones.

40. The method of claim 29, wherein said Gray code is represented by a "0" being an NRZI code of "0110", and a PR4 code of "010-1", and a "1" being an NRZI code of "1100", and a PR4 code of "10-1 0".

41. The method of claim 40, wherein said processing comprises delaying the successive bits of said data input signal to produce an output representing successive bits of said Gray code, multiplying a bit in a first and second bit position by −1.

* * * * *